United States Patent [19]
Takahashi

[11] Patent Number: 5,588,999
[45] Date of Patent: Dec. 31, 1996

[54] THIN FILM FORMING DEVICE

[75] Inventor: Hiroshi Takahashi, Ibaraki-ken, Japan

[73] Assignee: Eiko Engineering Co., Ltd., Ibaraki-ken, Japan

[21] Appl. No.: 513,153

[22] Filed: Aug. 9, 1995

[30] Foreign Application Priority Data

Jan. 17, 1995 [JP] Japan .................................. 7-023543

[51] Int. Cl.⁶ .................................................. C23C 16/00
[52] U.S. Cl. .................. 118/715; 118/719; 118/726; 118/723 EB; 118/723.03; 118/723 VE; 118/712; 118/713
[58] Field of Search .................................. 118/715, 719, 118/726, 723 EB, 723 CB, 723 VE, 712, 713; 117/85, 201, 203

[56] References Cited

U.S. PATENT DOCUMENTS

| | | | |
|---|---|---|---|
| 4,693,207 | 9/1987 | Hayakawa | 118/715 |
| 4,810,473 | 3/1989 | Tamura | 422/247 |
| 5,000,533 | 3/1991 | Gerwers | 350/96.2 |
| 5,143,896 | 9/1992 | Harada | 505/1 |
| 5,358,687 | 10/1994 | Ichikawa | 420/590 |
| 5,423,914 | 6/1995 | Nakamura | 118/719 |
| 5,456,205 | 10/1995 | Sheldon | 117/85 |

FOREIGN PATENT DOCUMENTS

| | | | |
|---|---|---|---|
| 60-163427 | 8/1985 | Japan | 117/85 |
| 60-176986 | 9/1985 | Japan | 117/203 |
| 62-45107 | 2/1987 | Japan | 117/85 |
| 63-109168 | 5/1988 | Japan | . |
| 5-190469 | 7/1993 | Japan | . |

*Primary Examiner*—Robert Kunemund
*Assistant Examiner*—Jeffrie R. Lund
*Attorney, Agent, or Firm*—Flynn, Thiel, Boutell & Tanis, P.C.

[57] ABSTRACT

A thin film forming device comprises a vacuum chamber which is vacuous inside, a substrate holder which is provided in the vacuum chamber for holding a substrate thereon and a molecular beam source disposed in the vacuum chamber directed toward the substrate holder. An endoscope is inserted in the vacuum chamber at the tip end thereof and is covered by a transparent protecting tube connected to the tip end of a bellows. As the bellows is stretched or retracted, the tip end portion of the endoscope and the protecting tube can be advanced to a space between the substrate held by the substrate holder and the molecular beam source or retracted into a shelter provided at a side of the space. As a result, it is possible to know the composition of a thin film as well as to observe the irradiation source of material of the thin film and the plasma radiation while the film is being formed on the film-forming surface of the substrate in the vacuum chamber.

7 Claims, 3 Drawing Sheets

1

THIN FILM FORMING DEVICE

BACKGROUND OF THE INVENTION

1. Field of the Invention

The present invention relates to a thin film forming device for forming a thin film on a substrate in a vacuum, particularly to that capable of observing and analyzing the state or process of the thin film growing on the substrate.

2. Description of the Related Art:

A representative thin film forming device is a molecular beam epitaxy device (referred to as an MBE device hereinafter). The MBE device comprises a molecular beam source such as a Knudsen cell (referred to as a K cell hereinafter) etc. disposed toward a substrate mounted on a substrate holder in a vacuum chamber which is kept at a high vacuum, the MBE device emitting therefrom molecules of material of the thin film toward a film-forming surface of the substrate to grow the thin film thereon. In case of the K cell which emits molecules by electric heating, a heater is covered by a shrouding which is cooled by liquid nitrogen etc.

In case an oxide film or a compound semiconductor film such as a high-temperature superconducting thin film etc. is formed in such an MBE device, it is performed under irradiation of a beam of electrically neutral and chemically active free radicals generated in plasma. In this case, a plasma beam source is disposed in the vacuum chamber toward the film-forming surface of the substrate adding to the molecular beam source described above.

Moreover it makes use of reflection high-energy electron diffraction (RHEED), wherein an electronic beam accelerated to 10~50 KeV is incident to the film-forming surface at a small angle so as to be diffracted thereon so that a diffraction pattern is projected on a fluorescent screen for observing the crystal lattice of the film, In this case, an electron gun is disposed in the vacuum chamber toward the film-forming surface of the substrate at a small angle relative thereto and the fluorescent screen is put over an observation window which is disposed at a side of the substrate opposite to the electron gun.

In the thin film forming device as described above, a film formed on the film-forming surface of the substrate is taken out from the vacuum chamber after completion of forming the film and the composition thereof is analyzed by photoluminescence etc. This method, however, is ineffective in knowing the composition of the film while the same is being formed. On the other hand, the RHEED is effective in knowing a crystal lattice in the film while the same is being formed, but ineffective in knowing the composition of mix crystal such as impurity densities etc.

Furthermore, in case the film is formed on the film-forming surface of the substrate under irradiation of the electrically neutral and chemically active free-radical beam, there is no other way to observe the plasma radiation of the plasma beam source than through the observation window provided on the vacuum chamber. Such a method of observation, however, is incapable of directly observing the plasma radiation. Accordingly, there has been no other way to know the state of plasma radiation than surmising from indirect data such as the voltage, current, etc. of a power supply to the plasma beam source.

Still furthermore, there has also been no other way to know the remaining amount etc. of a material of the molecular beam source such as the K cell etc. during the formation of the film than indirectly surmising from the speed of formation of the film and the like. Still furthermore in case of the K cell, a shrouding provided around a crucible for accommodating the material of the film therein is cooled to a low temperature so that the material is sometimes piled at the irradiation hole of molecules to close it. Such a situation cannot be observed through the observation window provided on the vacuum chamber.

SUMMARY OF THE INVENTION

In view of the problems of prior art set forth above, it is an object of the present invention to obtain a thin film forming device capable of observing the irradiation source of a thin film material, plasma radiation, the closing/opening of a shutter provided on the irradiation hole of a K cell and the like in a vacuum chamber and also capable of knowing the composition of a film while the same is being formed on the film-forming surface of a substrate.

In order to achieve the above object according to the present invention, the tip end portion of an endoscope 9 is inserted close to the film-forming surface of a substrate a in the vacuum chamber 1 for directly observing the film-forming surface of the substrate a. Particularly the composition of the film can be also analyzed while the same is being formed by way of a combination of an electron beam source 4 and a spectrometer 16.

That is, the thin film forming device according to the present invention is characterized in comprising the vacuum chamber 1 which is vacuous inside, a substrate holder 2 provided in the vacuum chamber 1 for holding the substrate a, an irradiation source disposed in the vacuum chamber 1 toward the substrate holder 2 for emitting a thin film material thereto and the endoscope 9 having an tip end portion inserted close to the film-forming surface of the substrate a in the vacuum chamber 1.

The endoscope 9 is accommodated in a transparent protecting tube 10 thereby to be separated from the inner space of the vacuum chamber 1. A shelter 11 is provided in the vacuum chamber 1 at a side of a space between the substrate a held by the substrate holder 2 and the irradiation source. Provided in the shelter 11 is a supporting member for supporting the tip end portion of the endoscope 9 and the protecting tube 10 in such a way that they can be projected to the space between the substrate a and the irradiation source and contracted inside the shelter 11. The supporting member is a telescopic bellows 8 connected to the protecting tube 10, and it is kept at the atmospheric pressure inside the bellows 8 and the protecting tube 10.

Otherwise, the endoscope 9 set forth above may be mounted on a shutter 19 provided in the vacuum chamber 1, the shutter 19 being capable of shading the substrate a held by the substrate holder 2 from the irradiation source.

The thin film forming device comprises the electron beam source 4 which emits electrons toward the film-forming surface as an exciting means for exciting the film-forming surface of the substrate a held by the substrate holder 2. The spectroscope 16 is connected to a scope 12 of the endoscope 9.

Since the endoscope 9 is inserted into the vacuum chamber 1 at the tip end thereof in the thin film forming device according to the present invention as described above, it is possible to surely and correctly observe the inside state of the vacuum chamber 1 which could not be observed through the conventional observation window, e.g., a film being formed on the film-forming surface of the substrate a, the irradiation hole of a material irradiation source 6 and the plasma radiation of a plasma beam source 5.

Especially, when the film-forming surface of the substrate a held by the substrate holder 2 is excited by the exciting means, it is possible to know the composition of the film by way of luminescence generated on the film-forming surface. For example, the composition of the film can be subjected to spectrochemical analysis by analyzing the luminescence using the spectrometer 16. In case the electron beam source 4 which emits high-energy electrons toward the film-forming surface of the substrate is used as the exciting means, the electron beam source 4 for RHEED can be used as it is also for this purpose, so that it is possible to know the composition as well as the crystal lattice of the film at the same time while the film is being formed.

Moreover, the endoscope 9 can be protected from the molecular and electron beams etc. by the transparent protecting tube 10 which separates it from the inner space of the vacuum chamber 1 when it is inserted into the vacuum chamber 1. Particularly it is possible to protect the protecting tube 10 and the tip end of the endoscope 9 from radiation in the shelter 11 when the thin film material is emitted from the material irradiation source 6 by moving them from the space between the substrate a held by the substrate holder 2 and the irradiation source to the shelter 11 disposed aside the space by way of the supporting member. As a result, it can be prevented that a film is formed on the protecting tube 10 to reduce the same in transparency. For example, the protecting tube 10 can freely move in the vacuum chamber 1 while being separated from the inner space of the vacuum chamber 1 to be kept at the atmospheric pressure inside as the protecting tube 10 is installed in the shelter 11 by way of the telescopic bellows 8.

On the other hand, in case the endoscope 9 is attached to a shutter 19 provided in the vacuum chamber 1 so as to be able to shade the substrate a held by the substrate holder 2 from the irradiation sources, the film-forming surface of the substrate a can be observed at any time, though the irradiation hole of the material irradiation source 6 and the plasma radiation of the plasma beam source 5 cannot be observed since they are shaded by the shutter 19. Moreover, the tip end of the endoscope 9 is protected by the shutter 19 from the molecular and electron beams.

DESCRIPTION OF THE PREFERRED EMBODIMENT

Embodiments of the present invention will be described hereinafter in concrete and in detail with reference to drawings.

Figure 1:
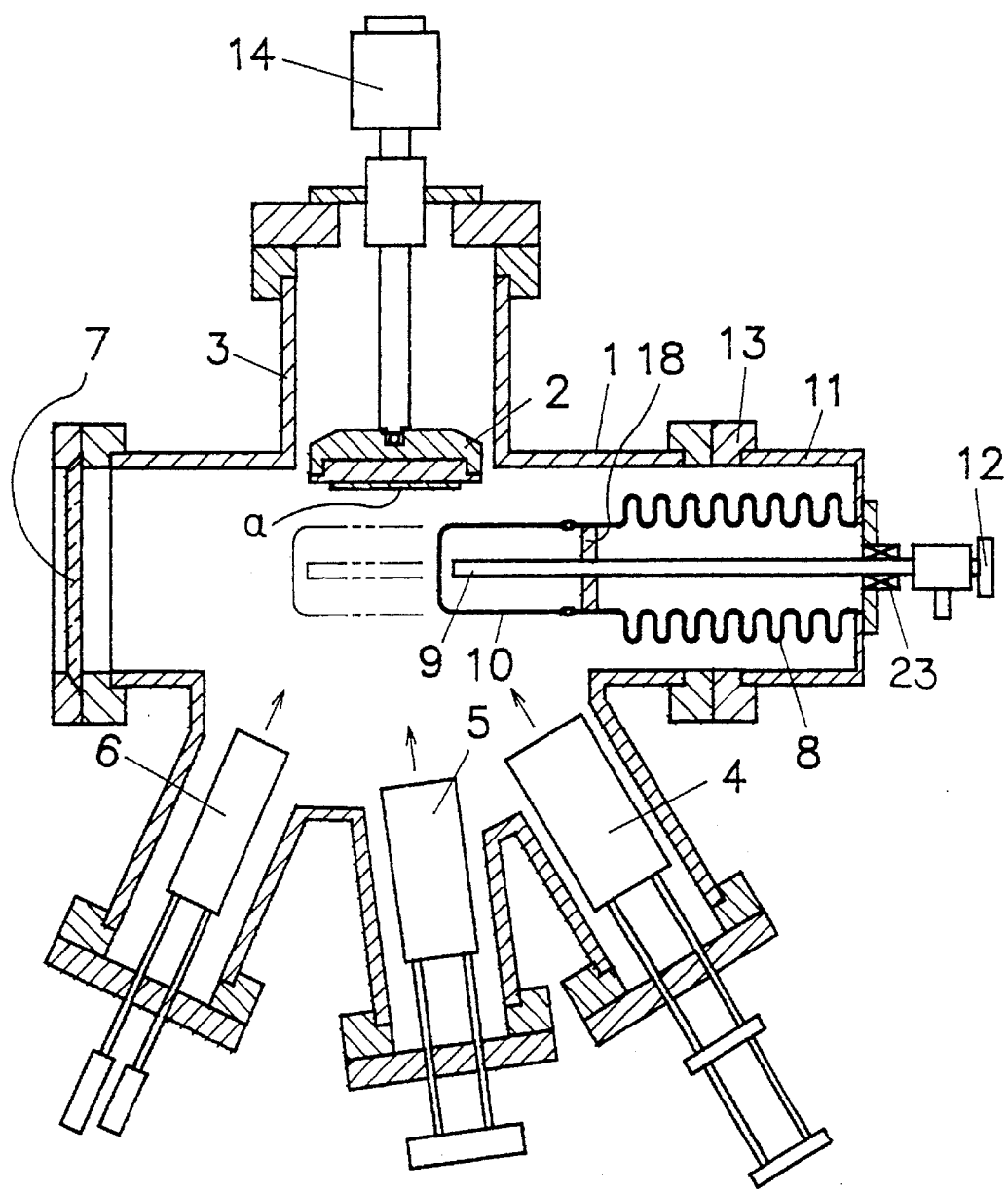
FIG. 1 is a schematic cross-sectional view of a vacuum chamber in a thin film forming device according to an embodiment of the invention.

As illustrated in FIG. 1, the inside of a vacuum chamber 1 made of a pressure-resistant container is decompressed to a given degree of vacuum by a vacuum pump, not shown.

Provided in the upper portion of the vacuum chamber 1 is a substrate introducing room 3, through which the tip end of a transfer rod 14 is introduced and the substrate holder 2 is attached thereto. A substrate a is attached to the lower surface of the substrate holder 2, the lower surface of the substrate a being a film-forming surface.

Various kinds of irradiation sources are disposed in the lower portion of the vacuum chamber 1 toward the film-forming surface of the substrate a held by the substrate holder 2. That is, a molecular beam source 6 such as a K cell is provided as an irradiation source of a thin film material, and molecules of the thin film material are emitted therefrom toward the film-forming surface of the substrate a.

A plasma beam source 5 is disposed in the vacuum chamber 1 toward the film-forming surface of the substrate a, a beam of electrically neutral and chemically active free radicals generated in plasma is emitted therefrom toward the film-forming surface of the substrate a.

An electron beam source 4 such as an electron gun etc. is disposed in the vacuum chamber 1 toward the film-forming surface of the substrate a, to which an electron beam accelerated to 10~50 KeV is incident, the electron beam source 4 and the electron beam emitted therefrom being disposed at a small angle relative to the film-forming surface of the substrate a. An observation window 7 is provided at a position opposite to the electron gun 4 in the vacuum chamber 1, and the electron beam diffracted by the film-forming surface displays a diffraction pattern on a fluorescent screen put over the observation window 7. A crystal lattice in a film formed on the film-forming surface of the substrate a is observed by way of the diffraction pattern, which is called reflection high energy electron diffraction (referred to as RHEED hereinafter).

There is provided a shelter 11 at a side of a space between the substrate a and the various kinds of irradiation sources. The shelter 11 is a cylindrical room connected to the vacuum chamber 1 by way of a flange 13, and comprises a telescopic bellows 8 therein. The bellows 8 is hermetically fixed to the end portion of the shelter 11 at the base end thereof and can be stretched from the end of the shelter 11 toward a position under the substrate holder 2 at the tip end thereof. Moreover, a protecting tube 10 which is cylindrical and closed at the end portion thereof is connected to the tip end of the bellows 8 hermetically by way of glass etc. As a result, the inside portions of the bellows 8 and the protecting tube 10 are hermetically separated from the inner space of the vacuum chamber 1 so as to be under the atmospheric pressure.

A cylindrical guide 23 is provided on the end surface of the shelter 11, and a long stick-shaped endoscope 9 is slidably inserted into the bellows 8 and the protecting tube 10 through the guide 23. A portion adjacent to the tip end of the endoscope 9 is fixed to the tip end side of the bellows 8 by way of a fixing member 18, so that the bellows 8 is stretched when the tip end of the endoscope 9 is inserted into the vacuum chamber 1, while it is contracted when the tip end of the endoscope 9 is withdrawn into the shelter 11. As a result, when the tip end of the endoscope 9 is slided into the vacuum chamber 1, the tip end of the endoscope 9 and the protecting tube 10 can be inserted to a position under the substrate holder 2, where the film-forming surface of the substrate a confronts the various kinds of irradiation sources, i.e., the material irradiation source 6, the plasma beam source 5 and the electron beam source 4. When the tip end of the endoscope 9 is withdrawn into the shelter 11, the tip end of the endoscope 9 and the protecting tube 10 are completely accommodated in the shelter 11 to take shelter from the various kinds of irradiation sources, i.e., the material irradiation source 6, the plasma beam source 5 and the electron beam source 4.

Figure 2:
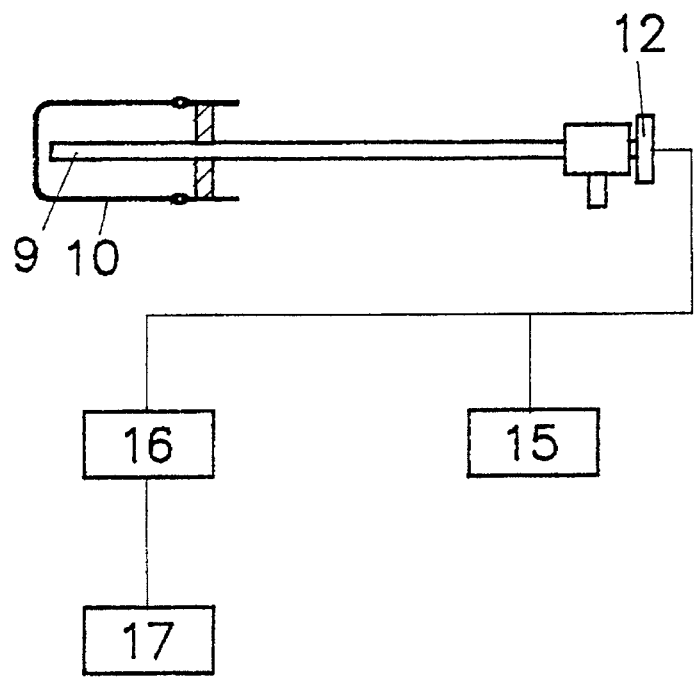
FIG. 2 is a schematic diagram showing the optical and electrical connections of the thin film forming device in FIG. 1.

The endoscope 9 comprises a scope 12 at the base end portion thereof, to which a spectrometer 16 is connected by way of an optical fiber as illustrated in FIG. 2 for subjecting light received by the endoscope 9 to spectrum analysis. Moreover, the spectrometer 16 is connected to a detector 17, which converts light into an electric signal. The scope 12 is connected to a monitoring display 15, on which the inside of the vacuum chamber 1 can be observed by way of the endoscope 9. In case the spectrometer 16, the detector 17, the monitoring display 15 and the like are not connected to the scope 12 of the endoscope 9, it is also possible to observe the inside of the vacuum chamber 1 on the scope 12.

Figure 3:
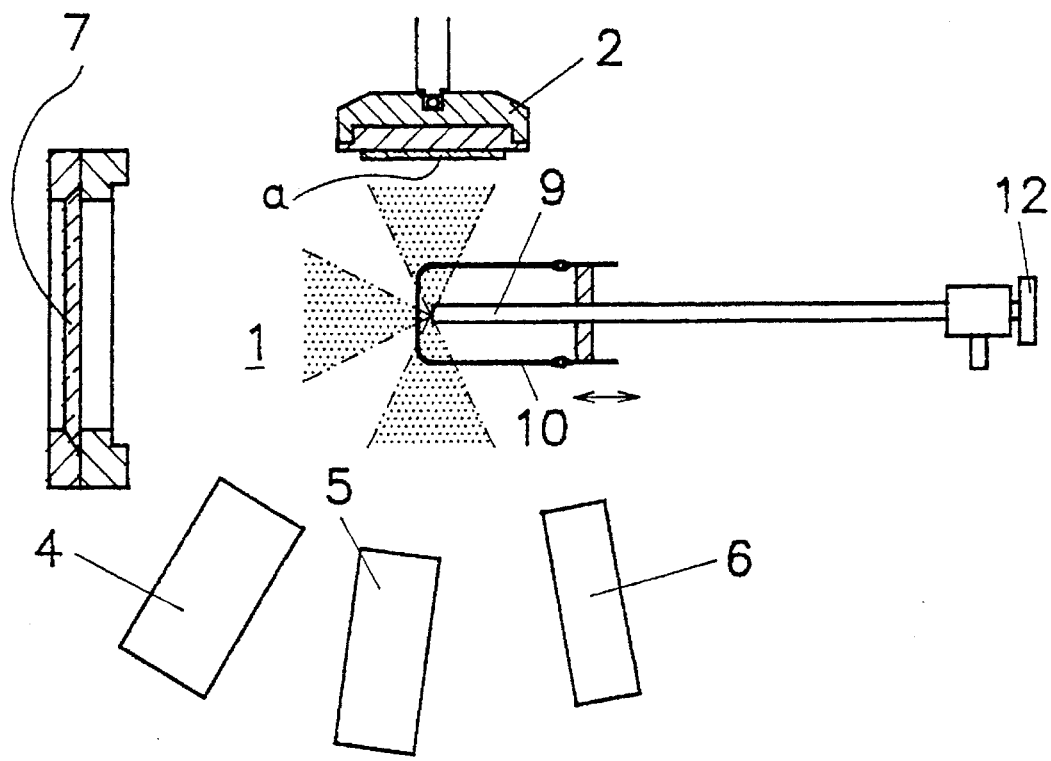
FIG. 3 is a view showing an arrangement of components in the vacuum chamber in FIG. 1, wherein fields of view are exemplified.

FIG. 3 shows the visual fields of the endoscope 9, i.e., the angles and directions thereof. As is often the case with well-known endoscopes 9, the angle of visual field is approximately 55° about the tip end thereof, and the direction of the visual field can be varied within a range of about 110° at each side of the front thereof, i.e., about 220° in total. Accordingly, in case of the angle of visual field of 55° as set forth above, the visual field of about 275° can be covered. Moreover, in case of a focus-adjusting type endoscope 9, the observation depth ranges from 0 to infinity. As a result, it is possible to observe almost all the portion inside the vacuum chamber 1 by longitudinally varying the position of the tip end of the endoscope 9. Therefore, It is possible to observe the film-forming surface of the substrate a and the various kinds of irradiation sources, particularly the remaining amount of material in the material irradiation source 6, the irradiation hole, the closing/opening state of the shutter, the spectrum of plasma radiation of the plasma beam source 5 and the like.

These observations are made while the emission of the thin film material molecules from the material irradiation source 6 is temporarily stopped, and when the emission of the thin film material molecules from the material irradiation source 6 is resumed to form the film, the tip end portion of the endoscope 9 and the protecting tube 10 are hidden in the shelter 11 in order to prevent the film forming material from adhering to the surface of the protecting tube 10 and shading the visual field of the endoscope 9.

In case it is dark inside the vacuum chamber 1, it is necessary to employ an endoscope 9 equipped with a light guide.

Moreover, in case the film-forming surface of the substrate a is irradiated with an electron beam emitted from the electron beam source 4 to observe a diffraction pattern generated by RHEED etc., luminescence is generated on a film formed on the film-forming surface. It is possible to analyze the constituents of the film, i.e., the composition of the film by subjecting the luminescence to spectrochemical analysis using the spectrometer 16 by way of the endoscope 9. As a result, it is possible to analyze the composition of mix crystal etc. of the film other than to analyze the crystal lattice of the film by way of the RHEED in the course of forming the film. As described above, it is possible to obtain a high practical effect by using the endoscope 9 together with the electron beam source 4.

The irradiation sources used in the above embodiments are most common and preferable, but various other irradiation sources are available. Moreover, it is a matter of course that the thin film forming device according to the present invention is also applicable to a sputtering device, a chemical vapor disposition (CVD) device and the like other than the MBE device.

Figure 4:
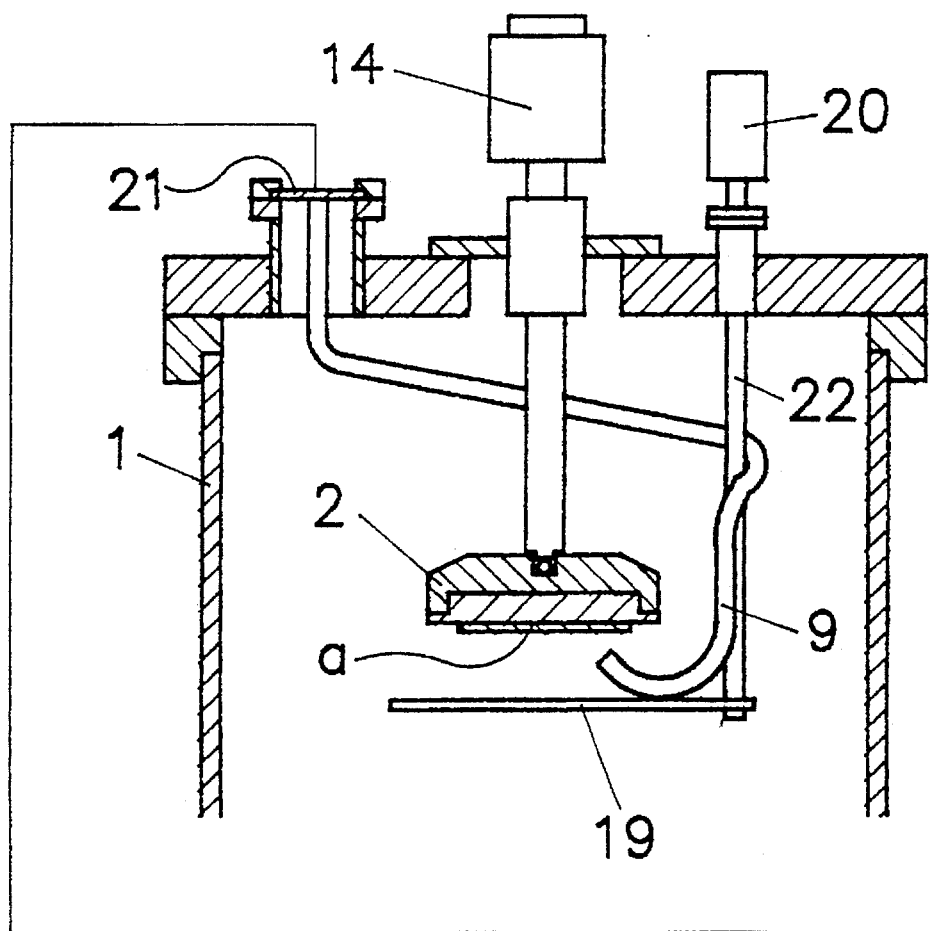
FIG. 4 shows a schematic cross-sectional view of a vacuum chamber in a thin film forming device according to the other embodiment of the invention and a schematic diagram of optical connection of an endoscope therein.

The other embodiment illustrated in FIG. 4 will be described hereinafter. In this embodiment, the endoscope 9 is attached to the shutter 19 at the tip end portion thereof with its tip end directed toward the film-forming surface of the substrate a mounted on the substrate holder 2. Irradiation sources such as the material irradiation source 6, the plasma beam source 5 or the electron beam source 4 (refer to FIG. 1) disposed toward the film forming surface of the substrate a as described above are provided under the substrate a and the shutter 19 can shade the substrate a from the irradiation sources. That is, the plate-shaped shutter 19 is turned about a shutter shaft 22 to shade the substrate a from the irradiation sources or expose the former to the latter by turning a knob 20.

Since the tip end portion of the endoscope 9 moves with the shutter 19 thereby to be always shaded from the irradiation sources, it is protected from the molecular and electron beams. Moreover, the tip end of the endoscope 9 is designed to face the film-forming surface of the substrate a when the same is shaded from the irradiation sources by the shutter 19. The endoscope 9 is connected to the spectrometer 16, the detector 17 and the monitoring display 15 as described above by way of a viewing port portion 21 provided in the upper portion of the vacuum chamber 1. Accordingly, it is possible to observe the film-forming surface of the substrate a when the same is shaded from the irradiation sources by the shutter 19 using the endoscope 9.

As described above, since the inside of the vacuum chamber 1 can be directly observed in the thin film forming device according to the present invention, it is possible to observe the film while the same is being formed and the states of various kinds of irradiation sources so as to be informed of them. Particularly it is possible to know the composition of the film too by a combination of a spectrometer and a means for exciting the film material on the film-forming surface of the substrate such as the RHEED electron gun, which facilitates the setting etc. of the film forming conditions during the formation of the film.

What is claimed is:

1. A thin film forming device comprising:

a vacuum chamber which is vacuous inside;

a substrate holder provided in said vacuum chamber for holding a substrate;

an irradiation source of thin film material disposed in said vacuum chamber towards said substrate holder; and an endoscope having a tip portion inserted close to a film-forming surface of said substrate in said vacuum chamber, said endoscope being disposed in a transparent protecting tube which separates said endoscope from an inner space of said vacuum chamber.

2. A thin film forming device according to claim 1, characterized in that said thin film forming device further comprises a shelter provided in said vacuum chamber at a side of a space between said substrate held by said substrate holder and said irradiation source and a supporting member in said shelter for supporting the tip end portion of said endoscope and said protecting tube in such a way that they can be projected to the space between said substrate and said irradiation source and retracted inside said shelter.

3. A thin film forming device according to claim 2, characterized in that said supporting member is a telescopic bellows connected to said protecting tube and it is kept at the atmospheric pressure inside said bellows and said protecting tube.

4. A thin film forming device according to claim 1, characterized in that said thin film forming device further comprises an exciting means for exciting said film-forming surface of said substrate held by said substrate holder.

5. A thin film forming device according to claim 4, characterized in that said exciting means for exciting said film-forming surface of said substrate held by said substrate holder is an electron beam source for irradiating said film-forming surface with electrons.

6. A thin film forming device according to claim 1, characterized in that a spectrometer is connected to a scope of said endoscope.

7. A thin film forming device comprising:

a vacuum chamber which is vacuous inside;

a substrate holder provided in said vacuum chamber for holding a substrate;

an irradiation source of thin film material disposed in said vacuum chamber towards said substrate holder; and an endoscope having a tip portion inserted close to a film-forming surface of said substrate in said vacuum chamber, said endoscope being attached to a shutter provided in said vacuum chamber so as to be able to shade said substrate held by said substrate holder from said irradiation source.

* * * * *